United States Patent
Fong et al.

(10) Patent No.: US 8,728,837 B2
(45) Date of Patent: May 20, 2014

(54) ENHANCING UNIFORMITY OF SLAB REGION THICKNESS IN OPTICAL COMPONENTS

(75) Inventors: Joan Fong, San Marino, CA (US); Wei Qian, Torrance, CA (US); Dazeng Feng, El Monte, CA (US); Mehdi Asghari, Pasadena, CA (US)

(73) Assignee: Kotura, Inc., Montery Park, CA (US)

( * ) Notice: Subject to any disclaimer, the term of this patent is extended or adjusted under 35 U.S.C. 154(b) by 233 days.

(21) Appl. No.: 13/506,910

(22) Filed: May 23, 2012

(65) Prior Publication Data
US 2013/0316484 A1    Nov. 28, 2013

(51) Int. Cl.
*H01L 21/00* (2006.01)
(52) U.S. Cl.
USPC .................................. 438/31; 438/29; 438/39

(58) Field of Classification Search
USPC .................................................. 438/29, 31, 39
See application file for complete search history.

(56) References Cited

U.S. PATENT DOCUMENTS

2005/0105853 A1*    5/2005   Liu et al. ........................ 385/43

* cited by examiner

*Primary Examiner* — Jae Lee
(74) *Attorney, Agent, or Firm* — Gavrilovich, Dodd & Lindsey, LLP

(57) ABSTRACT

A method of forming an optical device includes generating a device precursor having a layer of a light-transmitting medium on a base. The method also includes forming an etch stop on the layer of light-transmitting medium. An active medium is grown on the etch stop and on the light-transmitting medium such that the light-transmitting medium is between the base and the grown active medium. The grown active medium is etched down to the etch stop so as to define a ridge in the active medium. The ridge of active medium defines a portion of a component waveguide that will guide a light signal through an active component on the device.

13 Claims, 7 Drawing Sheets

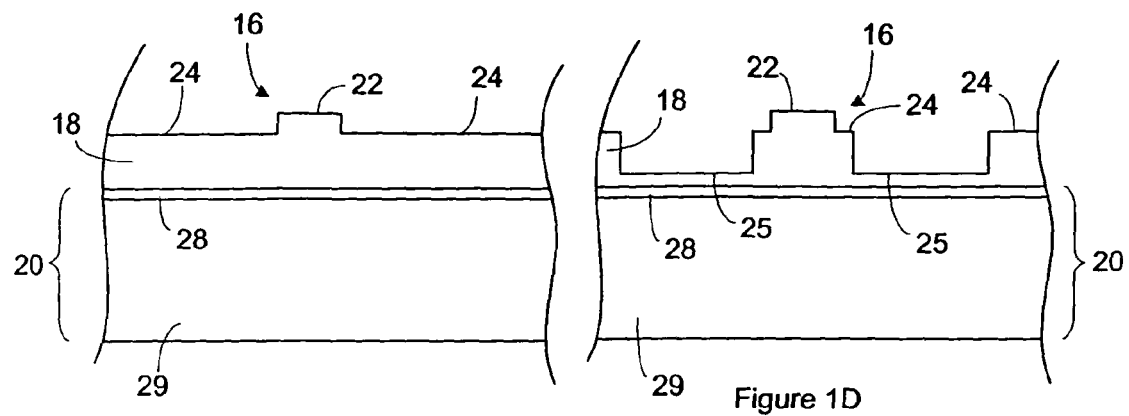
Figure 1C
Figure 1D
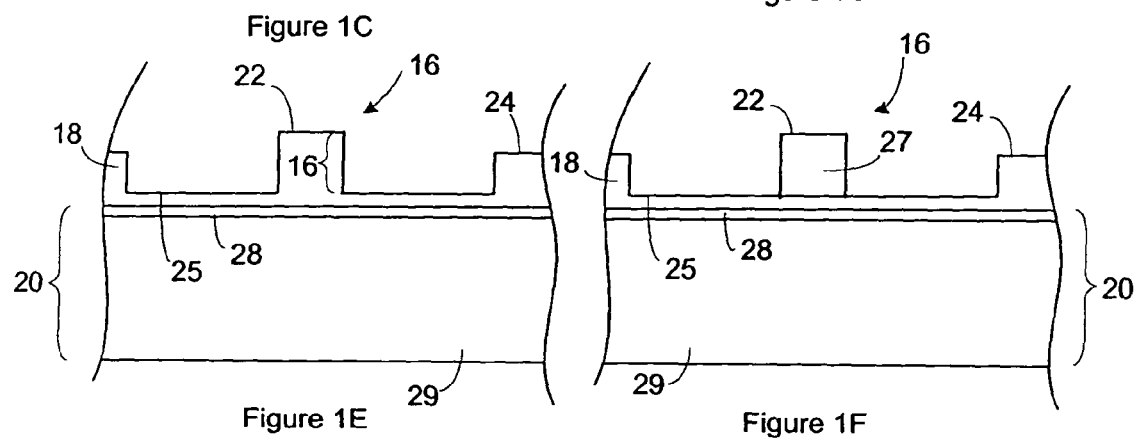
Figure 1E
Figure 1F

ENHANCING UNIFORMITY OF SLAB REGION THICKNESS IN OPTICAL COMPONENTS

FIELD

The present invention relates to optical devices and more particularly to devices having ridge waveguides.

BACKGROUND

A variety of optical devices include an active component such as a light sensor or modulator. These active components typically guide a light signal through a component waveguide while an electrical field is applied to the component waveguide. The component waveguide can be partially defined by a ridge that extends upwards from slab regions. The performance of these components is often very sensitive to the thickness of these slab regions. Since these slab regions are generally formed by etching, the thickness of the slab regions is difficult to control and can be inconsistent within a slab region. Additionally, the thickness of slab regions formed in different components on the same wafer can also be inconsistent. As a result, the performance of different active devices is often inconsistent. The inconsistency of these optical devices can provide an undesirably large level of waste in the fabrication process.

For the above reasons, there is a need for optical devices having consistent performance and/or reduced optical loss.

SUMMARY

A method of forming an optical device includes generating a device precursor having a layer of a light-transmitting medium on a base. The method also includes forming an etch stop on the layer of the light-transmitting medium. An active medium is grown on the etch stop and on the light-transmitting medium such that the light-transmitting medium is between the base and the grown active medium. The grown active medium is etched down to the etch stop so as to define a ridge in the active medium. The ridge of the active medium defines a portion of a component waveguide that will guide a light signal through an active component on the device.

BRIEF DESCRIPTION OF THE FIGURES

FIG. 1A through FIG. 1G illustrate an optical device having an active component configured to operate as a modulator and/or a light sensor. FIG. 1A is a perspective view of the device.

FIG. 1B is a topview of the portion of the optical device shown in FIG. 1A that includes an optical modulator.

FIG. 1C is a cross-section of the device shown in FIG. 1A taken along the line labeled C.

FIG. 1D is a cross-section of the optical device shown in FIG. 1A taken along the line labeled D.

FIG. 1E is a cross-section of the optical device shown in FIG. 1A taken along the line labeled E.

FIG. 1F is a cross-section of the optical device shown in FIG. 1A taken along the line labeled F.

FIG. 1G is a cross-section of the optical device shown in FIG. 1A taken along the line labeled G.

FIG. 2A is a cross-section of a device precursor used in the method of FIG. 2A through FIG. 2R.

FIG. 2B is a topview of the device precursor.

FIG. 2C is a cross section of the device precursor shown in FIG. 2B taken along the line labeled C.

FIG. 2J is a topview of the device precursor.

FIG. 2K is a cross-section of the device precursor taken along the line labeled K in FIG. 2J.

FIG. 2L is a topview of the device precursor.

FIG. 2M is a cross-section of the device precursor taken along the line labeled M in FIG. 2L.

FIG. 2N is a cross-section of the device precursor taken along the line labeled N in FIG. 2L.

FIG. 2O is a topview of the device precursor.

FIG. 2P is a cross-section of the device precursor taken along the line labeled P in FIG. 2O.

FIG. 2Q is a cross-section of the device precursor taken along the line labeled Q in FIG. 2O.

FIG. 2R and FIG. 2S illustrate the device precursor after etching the device precursor of FIG. 2O through FIG. 2Q. FIG. 2R corresponds to the cross-section of the device precursor of FIG. 2P but is shown after the component waveguide etch.

FIG. 2S corresponds to the cross-section of the device precursor of FIG. 2Q but is shown after the component waveguide etch.

FIG. 2T corresponds to the cross-section of the device precursor of FIG. 2R but is shown after the removal of the masks.

FIG. 2U corresponds to the cross-section of the device precursor of FIG. 2S but is shown after the removal of the masks.

DESCRIPTION

Figure 1A:
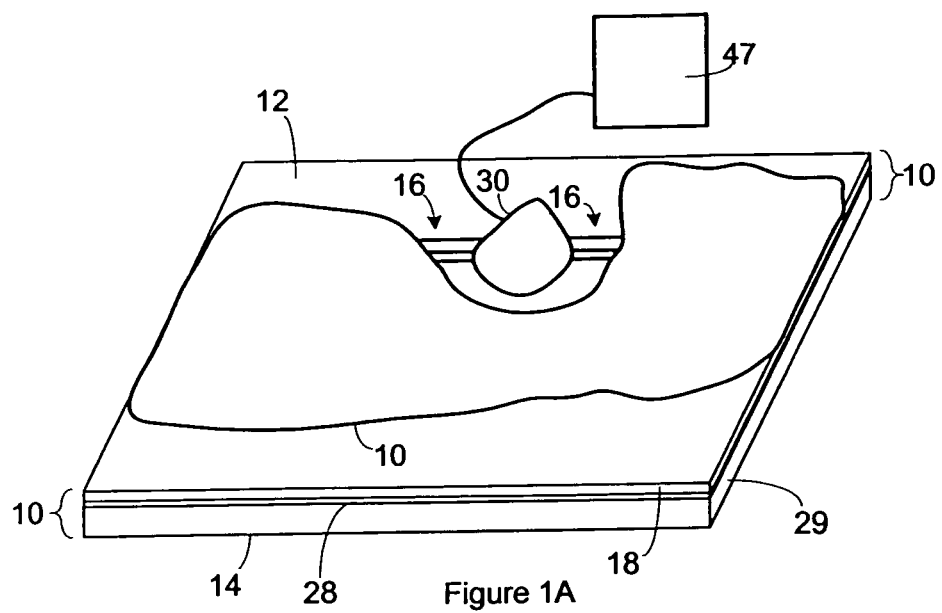

An optical device includes a device waveguide that carries light signals to and/or from an optical component such as an attenuator, modulator, light sensor, laser, amplifier, and multiplexer. The active component typically includes a component waveguide that receives a light signal from the device waveguide and then guides the received light signal through the active component. The device waveguides and the component waveguides are generally constructed of different materials. For instance, the device waveguide guides light signals though a ridge of a light-transmitting medium while the component waveguide guides light signals through a ridge of an active medium. The active medium is different from the light-transmitting medium.

These devices are generally constructed from a wafer that includes a layer of the light-transmitting medium at the desired thickness for the ridge of the light-transmitting medium. The ridge of light-transmitting medium is then etched into the wafer. Since the light-transmitting medium already has the thickness desired for the ridge, the resulting ridge has the desired dimension. In contrast, the active medium is grown on the wafer, polished to the desired thickness and the ridge is then etched into the active medium. When the ridge of the active medium is etched, the resulting ridge extends upwards from slab regions that also guide a portion of the light signal. The thickness of these slab regions strongly affects the performance of the optical component. Since the slab regions are formed by growing, polishing, and etching the active medium, the thickness of these slab regions is highly non-uniform within a single active component and also within different active components formed on the same wafer.

Rather than starting the fabrication process having a layer of the light-transmitting medium at the desired thickness for the ridge of the light-transmitting medium, the wafer starts with a layer of the light-transmitting medium that is the thickness that is desired for the slab regions associated with the ridge of the active medium. The device is then fabricated such that the original layer of the light-transmitting medium becomes the slab regions associated with the ridge of the active medium. Since the original layer of the light-transmitting medium on a wafer has a uniform thickness and this layer becomes the slab regions for the ridge of the active medium, these slab regions have the thickness uniformity that is required for operation of the active components. Further, since multiple devices are constructed on a single wafer, the thickness uniformity is achieved not only within a single active component but is also achieved across the different devices fabricated on that wafer. Further, the disclosed method allows the thickness of the slab regions associated with the active component to be precisely controlled. For instance, the desired thickness of the slab regions can be achieved merely by using a wafer where the original layer of the light-transmitting medium has the thickness that is required for a particular active component. Accordingly, the level of fabrication waste for the disclosed devices is reduced and the performance of the active components is improved.

Figure 1B:
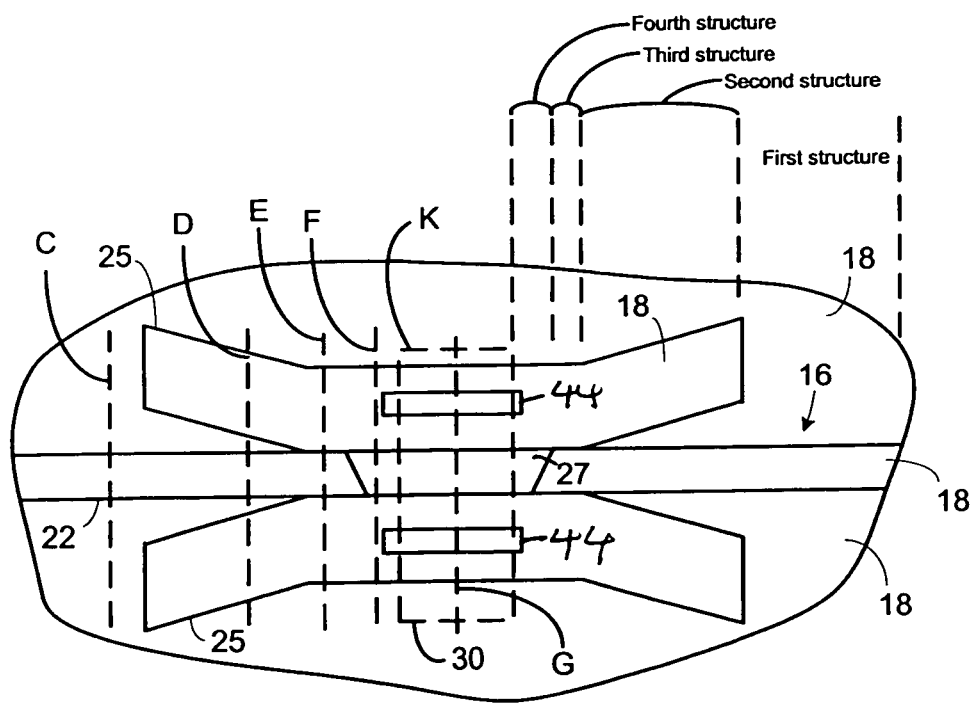
Figure 1G:
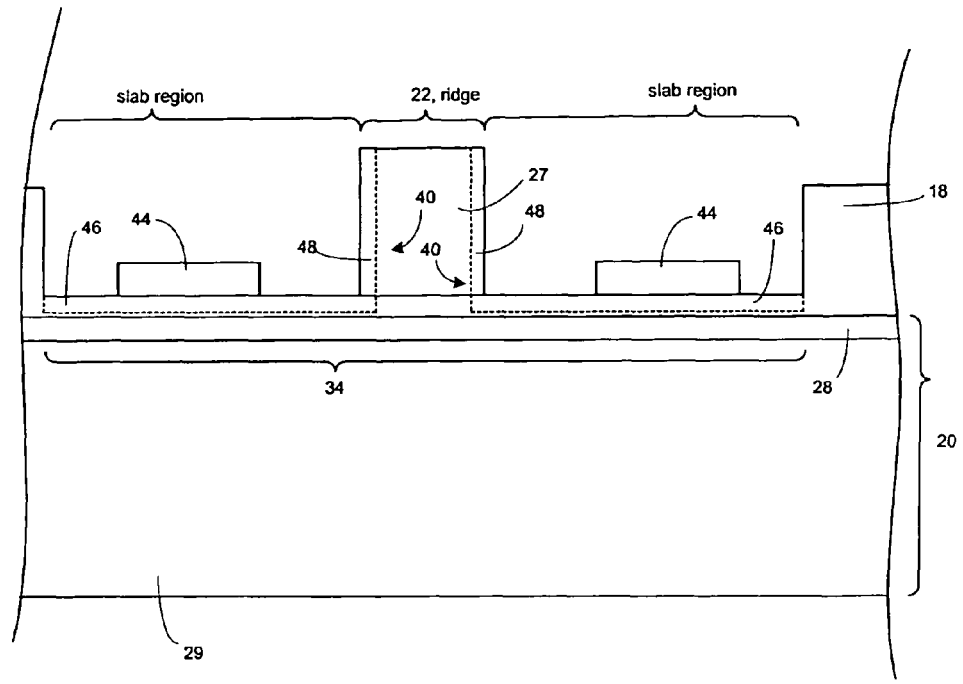

FIG. 1A through FIG. 1G illustrate an optical device having a waveguide that includes a modulator. FIG. 1A is a perspective view of the device. FIG. 1B is a topview of the portion of the optical device shown in FIG. 1A that includes an optical modulator. FIG. 1C is a cross-section of the device shown in FIG. 1A taken along the line labeled C. FIG. 1D is a cross-section of the optical device shown in FIG. 1A taken along the line labeled D. FIG. 1E is a cross-section of the optical device shown in FIG. 1A taken along the line labeled E. FIG. 1F is a cross-section of the optical device shown in FIG. 1A taken along the line labeled F. FIG. 1G is a cross-section of the optical device shown in FIG. 1A taken along the line labeled G.

The device is within the class of optical devices known as planar optical devices. These devices typically include one or more waveguides immobilized relative to a substrate or a base. The direction of propagation of light signals along the waveguides is generally parallel to a plane of the device. Examples of the plane of the device include the topside of the base, the bottom side of the base, the topside of the substrate, and/or the bottom side of the substrate.

The illustrated device includes lateral sides 10 (or edges) extending from a topside 12 to a bottom side 14. The propagation direction of light signals along the length of the waveguides on a planar optical device generally extends through the lateral sides 10 of the device. The topside 12 and the bottom side 14 of the device are non-lateral sides.

The device includes one or more waveguides 16 that carry light signals to and/or from optical components 17. Examples of optical components 17 that can be included on the device include, but are not limited to, one or more components selected from a group consisting of facets through which light signals can enter and/or exit a waveguide, entry/exit ports through which light signals can enter and/or exit a waveguide from above or below the device, multiplexers for combining multiple light signals onto a single waveguide, demultiplexers for separating multiple light signals such that different light signals are received on different waveguides, optical couplers, optical switches, lasers that act a source of a light signal, amplifiers for amplifying the intensity of a light signal, attenuators for attenuating the intensity of a light signal, modulators for modulating a signal onto a light signal, modulators that convert an light signal to an electrical signal, and vias that provide an optical pathway for a light signal traveling through the device from the bottom side 14 of the device to the top side 12 of the device. Additionally, the device can optionally, include electrical components. For instance, the device can include electrical connections for applying a potential or current to a waveguide and/or for controlling other components on the optical device.

A portion of the waveguide includes a first structure where a portion of the waveguide 16 is defined in a light-transmitting medium 18 positioned on a base 20. For instance, a portion of the waveguide 16 is partially defined by a ridge 22 extending upward from a slab portion of the light-transmitting medium 18 as shown in FIG. 1C. In some instances, the top of the slab portion is defined by the bottom of trenches 24 extending partially into the light-transmitting medium 18 or through the light-transmitting medium 18. Suitable light-transmitting media include, but are not limited to, silicon, polymers, silica, SiN, GaAs, InP and LiNbO$_3$. One or more cladding layers (not shown) are optionally positioned on the light-transmitting medium. The one or more cladding layers can serve as a cladding for the waveguide 16 and/or for the device. When the light-transmitting medium 18 is silicon, suitable cladding layers include, but are not limited to, silicon, polymers, silica, SiN, GaAs, InP and LiNbO$_3$.

Recesses 25 (FIG. 1B) extend into the slab portions such that the ridge 22 is positioned between recesses 25. The recesses 25 can extend only part way into the light-transmitting medium 18 or through the light-transmitting medium 18. As is evident from FIG. 1D, the recesses 25 can be spaced apart from the ridge 22. As a result, a portion of the waveguide 16 includes a second structure where an upper portion of the waveguide 16 is partially defined by the ridge 22 extending upward from the slab portions and a lower portion of the waveguide is partially defined by recesses 25 extending into the slab portions and spaced apart from the ridge.

As shown in FIG. 1E, the recesses 25 can approach the ridge 22 such that the sides of the ridge 22 and the sides of the recesses 25 combine into a single surface 26. As a result, a portion of a waveguide includes a third structure where the waveguide is partially defined by the surface 26.

As is evident in FIG. 1B, an active medium 27 defines a portion of the waveguide that serves as a component waveguide. The component waveguide is butt-coupled with the ridge of the light-transmitting medium such that the component waveguide receives the light signals from the portion of the waveguide having the third structure and guides the received light signals to another portion of the waveguide having the third structure.

In FIG. 1F, a ridge 22 of active medium 27 extends upward from slab regions of the light-transmitting medium 18. In particular, the ridge 22 of active medium 27 contacts and extends upward from the portion of the light-transmitting medium 18 that defines the bottom of the recess 25. Accordingly, a portion of a waveguide includes a fourth structure where the waveguide is partially defined by the top and lateral sides of the active medium 27. When the light signal travels from the ridge of the light-transmitting medium into the ridge of the active medium, a portion of the waveguide enters the portion of the light-transmitting medium 18 located between the active medium and the base.

As is evident in FIG. 1B, there is an interface between each facet of the active medium 27 and a facet of the light-transmitting medium 18. The interface can have an angle that is non-perpendicular relative to the direction of propagation of light signals through the waveguide 16 at the interface. In some instances, the interface is substantially perpendicular relative to the base 20 while being non-perpendicular relative to the direction of propagation. The non-perpendicularity of the interface reduces the effects of back reflection. Suitable angles for the interface relative to the direction of propagation include but are not limited to, angles between 80° and 89°, and angles between 80° and 85°.

The portion of the base 20 adjacent to the light-transmitting medium 18 is configured to reflect light signals from the waveguide 16 back into the waveguide 16 in order to constrain light signals in the waveguide 16. For instance, the portion of the base 20 adjacent to the light-transmitting medium 18 can be an optical insulator 28 with a lower index of refraction than the light-transmitting medium 18. The drop in the index of refraction can cause reflection of a light signal from the light-transmitting medium 18 back into the light-transmitting medium 18. The base 20 can include the optical insulator 28 positioned on a substrate 29. As will become evident below, the substrate 29 can be configured to transmit light signals. For instance, the substrate 29 can be constructed of a light-transmitting medium 18 that is different from the light-transmitting medium 18 or the same as the light-transmitting medium 18. In one example, the device is constructed on a silicon-on-insulator wafer. A silicon-on-insulator wafer includes a silicon layer that serves as the light-transmitting medium 18. The silicon-on-insulator wafer also includes a layer of silica positioned on a silicon substrate. The layer of silica can serving as the optical insulator 28 and the silicon substrate can serve as the substrate 29.

The optical device includes an active component 30 such as a modulator and/or light sensor. The location of the active component on the optical device is illustrated by the line labeled K in FIG. 1B. In order to simplify FIG. 1B, the details of the active component construction are not shown in FIG. 1B. However, the active component construction is evident from other illustrations such as FIG. 1G. The active component construction of FIG. 1G is constructed on the portion of the waveguide having a fourth structure constructed according to FIG. 1F. The perimeter of portions of doped regions shown in FIG. 1G are illustrated with dashed lines to prevent them from being confused with interfaces between different materials. The interfaces between different materials are illustrated with solid lines. When the active component is configured to operate as a modulator, the active component construction is configured to apply an electric field to the active medium 27 in order to phase and/or intensity modulate the light signals received by the modulator.

A ridge 22 of the active medium 27 extends upward from slab regions of the light-transmitting medium 18. Doped regions 40 are both in the slab regions of the light-transmitting medium 18 and also in the ridge of the active medium 27. For instance, doped regions 40 of the active medium 27 are positioned on the lateral sides of the ridge 22 of the active medium 27. In some instances, each of the doped regions 40 extends up to the top side of the active medium 27 as shown in FIG. 1G. Additionally, the doped regions 40 extend away from the ridge 22 into the slab regions of the light-transmitting medium 18. The transition of a doped region 40 from the ridge 22 of the active medium 27 into the slab regions of the light-transmitting medium 18 can be continuous and unbroken as shown in FIG. 1G.

Each of the doped regions 40 can be an N-type doped region or a P-type doped region. For instance, each of the N-type doped regions can include an N-type dopant and each of the P-type doped regions can include a P-type dopant. In some instances, the active medium 27 includes a doped region 40 that is an N-type doped region and a doped region 40 that is a P-type doped region. The separation between the doped regions 40 in the active medium 27 results in the formation of PIN (p-type region-insulator-n-type region) junction in the modulator 30.

In the active medium 27, suitable dopants for N-type regions include, but are not limited to, phosphorus and/or arsenic. Suitable dopants for P-type regions include, but are not limited to, boron. The doped regions 40 are doped so as to be electrically conducting. A suitable concentration for the P-type dopant in a P-type doped region includes, but is not limited to, concentrations greater than $1\times10^{15}$ cm$^{-3}$, $1\times10^{17}$ cm$^{-3}$, or $1\times10^{19}$ cm$^{-3}$, and/or less than $1\times10^{17}$ cm$^{-3}$, $1\times10^{19}$ cm$^{-3}$, or $1\times10^{21}$ cm$^{-3}$. A suitable concentration for the N-type dopant in an N-type doped region includes, but is not limited to, concentrations greater than $1\times10^{15}$ cm$^{-3}$, $1\times10^{17}$ cm$^{-3}$, or $1\times10^{19}$ cm$^{-3}$, and/or less than $1\times10^{17}$ cm$^{-3}$, $1\times10^{19}$ cm$^{-3}$, or $1\times10^{21}$ cm$^{-3}$.

Electrical conductors 44 are positioned on the slab regions of the light-transmitting medium 18. In particular, the electrical conductors 44 each contact a portion of a doped region 40 that is in the slab regions of the light-transmitting medium 18. Accordingly, each of the doped regions 40 is degeneratively doped at a concentration that allows it to provide electrical communication between an electrical conductor 44 and one of the doped regions 40 in the active medium 27. As a result, electrical energy can be applied to the electrical conductors 44 in order to apply an electric field to the active medium 27. The region of the light-transmitting medium 18 or active medium between the doped regions 40 can be undoped or lightly doped as long as the doping is insufficient for the doped material to act as an electrical conductor that electrically shorts the active component.

Figure 1H:
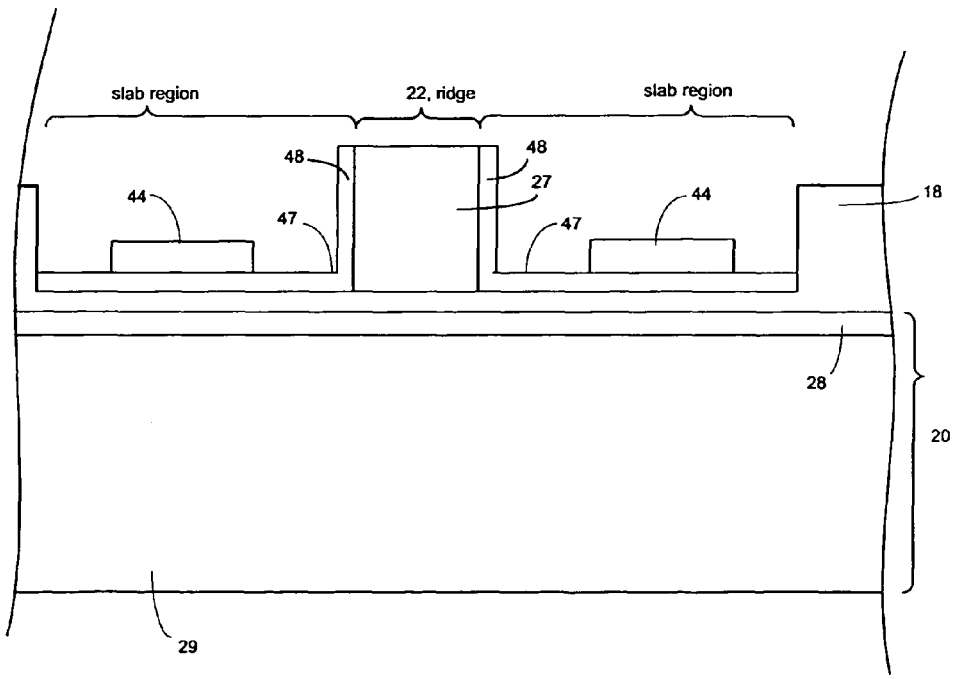
FIG. 1H is a cross-section of the optical device shown in FIG. 1A taken along the line labeled G.

FIG. 1H is a cross-section of another embodiment of an active component. The cross-section shown in FIG. 1H can represent a cross section of the device shown in FIG. 1B taken along the line labeled G in FIG. 1B. The active component construction of FIG. 1H is constructed on the portion of the waveguide having a fourth structure constructed according to FIG. 1F. The modulator includes electrical current carriers 47 as functional replacements for the doped regions in the active component of FIG. 1G. Current carriers 47 are each positioned on the slab regions and also extend at least part way up a side of the ridge of the active medium. The transition of a current carrier 47 from the ridge 22 of the active medium 27 onto a slab region of the light-transmitting medium 18 can be continuous and unbroken as shown in FIG. 1H.

As is evident from FIG. 1H, the current carriers 47 can extend from one of the slab regions and into contact with the ridge before extending up a lateral side of the ridge. The height of the portion of the current carriers 47 extending up the lateral side of the ridge can be greater than the thickness of the portion of the current carrier located on the base. As a result, a portion of each current carrier can be located above the portion of the current carrier located on the base. In this arrangement, the top of the portion of the current carrier over the base moves toward the ridge turns or bends upward as a result of the current carrier extending up the lateral side of the ridge. The current carriers 47 preferable extend up more than 50%, 75%, or 90% of the height of the ridge 22.

The portion of the current carriers 47 located on the base can extend further away from the ridge than the thickness of the portion of the current carrier extending up the side of the ridge. In this arrangement, the top of the portion of the current carrier on the ridge moves toward the base and then turns or bends away from the ridge as a result of the current carrier extending away from the ridge. The current carriers can extend more than 5 µm, 10 µm, or 15 µm away from the ridge 22.

A suitable current carrier 47 includes electrically conducting materials such as metals that form a Schottky barrier at the interface of the current carrier 47 and the active medium 27. However, many of these materials absorb light at undesirably high levels. Another alternative for the current carrier 47 is electrically conducting materials that are transmit light at the operational wavelengths but form neither a Schottky barrier at the interface of the current carrier 47 and the active medium 27 nor a depletion region within the active medium during the application of a reverse bias. In these instances, the index of refraction for the current carrier 47 is preferably less than the index of refraction of the active medium in order to reduce or prevent entry of light into the current carrier 47 from the active medium. Examples of these materials may include conducting polymers such as poly(3,4-ethylenedioxythiophene): poly(styrene sulfonate) (PEDOT: PSS). Operation of the active component without a Schottky barrier(s) or depletion region is likely to be undesirably slow.

In another option, a carrier material that transmits light and is doped serves as one or more of the current carriers 47. In these instances, the index of refraction for the current carrier 47 can be less than the index of refraction of the active medium in order to reduce or prevent entry of light into the current carrier 47 from the active medium. In some instances, the index of refraction of the current carrier 47 is also less than the index of refraction of the light-transmitting medium in order to reduce or prevent entry of light into the current carrier 47 from the active medium. When the active medium 27 is germanium or $Ge_{1-x}Si_x$ (germanium-silicon) where x is greater than or equal to zero, an example of a suitable carrier material includes, but is not limited to, polysilicon, amorphous silicon, and indium tin oxide.

Doping of the material of the current carrier 47 can make the carrier material electrically conducting and/or increase the electrical current carrying capability of the carrier material. As shown in FIG. 1H, the entire carrier material can be doped and can accordingly serve as the current carrier. Alternately, a portion of the carrier material can be doped. Since the doping can increase the electrical conductivity of the carrier medium, each doping region can extend from contacting one of the electrical conductors 44 into contact with the ridge of the active medium 27.

As will be described below, the carrier material can be doped such that a depletion region forms in the active medium 27 upon application of a reverse bias to the active component. The depletion region can increase the response time of the active component. Accordingly, moving the doped regions 48 of one or more current carriers 47 closer to the ridge of the active medium 27 can increase the size of the depletion region. In some instances, the carrier material is doped such that one or more of the doped regions 48 each contacts the ridge of the active medium 27.

Each of the doped regions 48 can be an N-type doped region or a P-type doped region. For instance, each of the N-type doped regions can include an N-type dopant and each of the P-type doped regions can include a P-type dopant. In some instances, a current carrier 47 includes a doped region 48 that is an N-type doped region and on the opposing side of the ridge is another current carrier 47 that includes a doped region 48 that is a P-type doped region. In this instance, the active medium separates the doped regions 48 so as to form a P-I-N (p-type region-intrinsic region-n-type region) junction in the active component. Accordingly, under reverse bias, the intrinsic region (the active medium 27) can be depleted of carriers (form a depletion region) and accordingly build up a field that quickly sweeps the carriers out of the intrinsic region. This configuration increases the response speed of the active component.

Suitable dopants for N-type regions include, but are not limited to, phosphorus and/or arsenic. Suitable dopants for P-type regions include, but are not limited to, boron. A suitable concentration for the P-type dopant in a P-type doped region includes, but is not limited to, concentrations greater than $1\times10^{15}$ cm$^{-3}$, $1\times10^{17}$ cm$^{-3}$, or $1\times10^{19}$ cm$^{-3}$, and/or less than $1\times10^{17}$ cm$^{-3}$, $1\times10^{19}$ cm$^{-3}$, or $1\times10^{21}$ cm$^{-3}$. A suitable concentration for the N-type dopant in an N-type doped region includes, but is not limited to, concentrations greater than $1\times10^{15}$ cm$^{-3}$, $1\times10^{17}$ cm$^{-3}$, or $1\times10^{19}$ cm$^{-3}$, and/or less than $1\times10^{17}$ cm$^{-3}$, $1\times10^{19}$ cm$^{-3}$, or $1\times10^{21}$ cm$^{-3}$.

Electrical conductors 44 are positioned on the current carriers 47. When the current carriers 47 include doped regions 48 for carrying electrical energy, the doped regions 48 preferably extend from the electrical conductor to the active medium in the ridge. For instance, FIG. 1H shows the electrical conductors 44 each contacting a portion of a doped region 48 that is included in a current carrier 47 and the contacted doped region 48 extends into contact with the active medium 27 in the ridge 22. Accordingly, each of the current carriers 47 can provide electrical communication between an electrical conductor 44 and the active medium 27 in the ridge. As a result, electrical energy can be applied to the electrical conductors 44 in order to apply the electric field to the active medium 27.

The region of the light-transmitting medium or active medium between the current carriers 47 can be undoped or lightly doped as long as the doping is insufficient for the doped material to act as an electrical conductor that electrically shorts the active component.

An active component constructed according to FIG. 1G or FIG. 1H can be operated as a modulator. During operation of the active component as a modulator, electronics 47 (FIG. 1A) can be employed to apply electrical energy to the electrical conductors 44 so as to form an electrical field in the active medium 27. For instance, the electronics can form a voltage differential between the field sources. The electrical field can be formed without generating a significant electrical current through the active medium 27. The active medium 27 can be a medium in which the Franz-Keldysh effect occurs in response to the application of the electrical field. The Franz- Keldysh effect is a change in optical absorption and optical phase by an active medium 27. For instance, the Franz-Keldysh effect allows an electron in a valence band to be excited into a conduction band by absorbing a photon even though the energy of the photon is below the band gap. To utilize the Franz-Keldysh effect the active region can have slightly larger bandgap energy than the photon energy of the light to be modulated. The application of the field lowers the absorption edge via the Franz-Keldysh effect and makes absorption possible. The hole and electron carrier wavefunctions overlap once the field is applied and thus generation of an electron-hole pair is made possible. As a result, the active medium 27 can absorb light signals received by the active medium 27 and increasing the electrical field increases the amount of light absorbed by the active medium 27. Accordingly, the electronics can tune the electrical field so as to tune the amount of light absorbed by the active medium 27. As a result, the electronics can intensity modulate the electrical field in order to modulate the light signal. Additionally, the electrical field needed to take advantage of the Franz-Keldysh effect generally does not involve generation of free carriers by the electric field.

Suitable active media 27 for use in the modulator include electro-absorption media 27 such as semiconductors. However, the light absorption characteristics of different semiconductors are different. A suitable semiconductor for use with modulators employed in communications applications includes $Ge_{1-x}Si_x$ (germanium-silicon) where x is greater than or equal to zero. In some instances, x is less than 0.05, or 0.01. Changing the variable x can shift the range of wavelengths at which modulation is most efficient. For instance, when x is zero, the modulator is suitable for a range of 1610-1640 nm. Increasing the value of x can shift the range of wavelengths to lower values. For instance, an x of about 0.005 to 0.01 is suitable for modulating in the c-band (1530-1565 nm).

An active component constructed according to FIG. 1G or FIG. 1H can be operated as a light sensor in addition or as an alternative to operating it as a modulator. For instance, the active medium 27 can be a light-absorbing medium such as germanium. During operation of the active component, a reverse bias electrical field is applied across the active medium 27. When the active medium 27 absorbs a light signal, an electrical current flows through the active medium 27. As a result, an electrical current through the light-absorbing medium indicates receipt of a light signal. Additionally, the magnitude of the current can indicate the power and/or intensity of the light signal. Different active media 27 can absorb different wavelengths and are accordingly suitable for use in a light sensor depending on the function of the light sensor. A light-absorbing medium that is suitable for detection of light signals used in communications applications includes, but are not limited to, germanium, silicon germanium, silicon germanium quantum well, GaAs, and InP. Germanium is suitable for detection of light signals having wavelengths in a range of 1300 nm to 1600 nm.

A suitable thickness (distance between top of ridge 22 and the base 20) for the portion of the waveguide 16 having the first structure (FIG. 1C) includes, but is not limited to, heights greater than 1 µm, 2 µm, and 3 µm. A suitable width of the ridge for the portion of the waveguide 16 having the first structure (FIG. 1C) includes, but is not limited to, widths greater than 1 µm, 2 µm, and 3 µm. A suitable height (distance between top of ridge 22 and the slab portions) for the portion of the waveguide 16 having the first structure (FIG. 1C) includes, but is not limited to, heights greater than 1 µm, 2 µm, or 3 µm and/or less than 4 µm, 5 µm, or 6 µm. A suitable thickness for the slab regions extending outward from the active medium includes, but is not limited to, a thickness greater than 0.1 µm, 0.2 µm, or 0.3 µm and/or less than 0.4 µm, 0.5 µm, or 0.6 µm. A suitable width for the top of the ridge of the active medium includes, but is not limited to, a width greater than 0.4 µm, 0.6 µm, or 0.7 µm and/or less than 0.9 µm, 1.2 µm, or 1.5 µm.

Modulators and/or light sensors having a cross section according to 1G or FIG. 1H can be used in configurations other than the configuration of FIG. 1A through 1F. Additional details about the fabrication, structure and operation of a modulator having a cross section according to FIG. 1G or FIG. 1H can be found in U.S. patent application Ser. No. 12/653,547, filed on Dec. 15, 2009, entitled "Optical Device Having Modulator Employing Horizontal Electrical Field," and incorporated herein in its entirety. Additional details about the fabrication, structure and operation of a light sensor having a cross section according to FIG. 1G or FIG. 1H can be found in U.S. Patent Application No. 61/572,841, filed on Jul. 21, 2011, entitled "Optical Device Having Light Sensor with Doped Regions;" and also in U.S. patent application Ser. No. 13/136,828, filed on Aug. 10, 2011, entitled "Application of Electrical Field Power to Light-Transmitting Medium," each of which is incorporated herein in its entirety.

As discussed above, the thickness of the slab regions associated with the active component is preferably uniform and controllable in order to achieve the desired performance from the active component. A method for achieving the required level of uniformity and control of slab region thickness can be performed on a wafer having an original layer of the light-transmitting medium 18 that has the thickness that is desired for the slab regions and then processing the wafer such that the layer of the light-transmitting medium 18 that was originally present on the wafer becomes the slab regions. In one example, an etch stop is formed over the original layer of light-transmitting medium 18 on the wafer. The active medium is then grown on the etch stop and the ridge is etched into the active medium. The etch etches down to the etch stop and the etch stop is optionally removed. As a result, the layer of the light-transmitting medium 18 that was originally present on the wafer becomes the slab regions extending outward from the resulting ridge of the active medium.

Figure 2A:
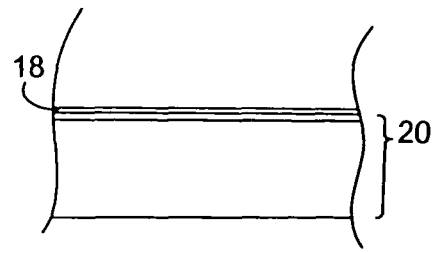
FIG. 2A through FIG. 2R illustrate an example of a method of forming an active component having a cross section as shown in FIG. 1A through FIG. 1H.
Figure 2B:
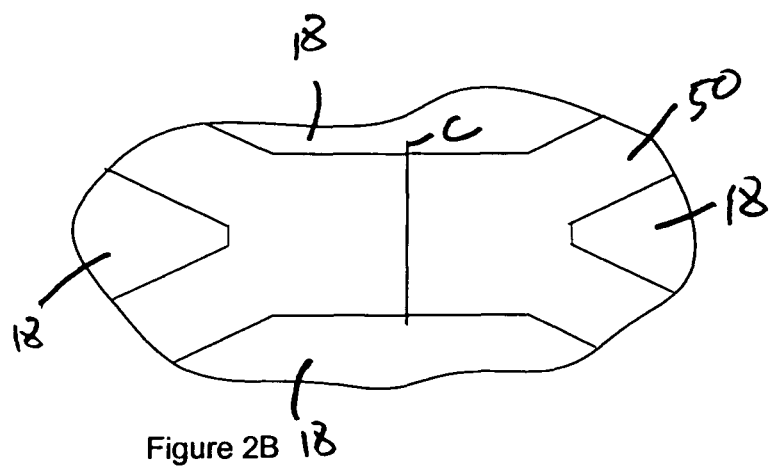
FIG. 2B and FIG. 2C illustrate a first mask formed on the device precursor of FIG. 2A.
Figure 2C:
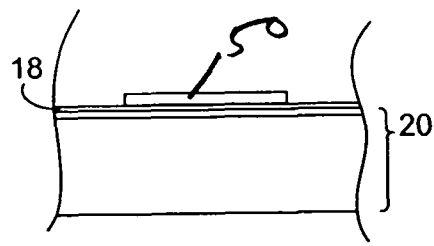
Figure 2D:
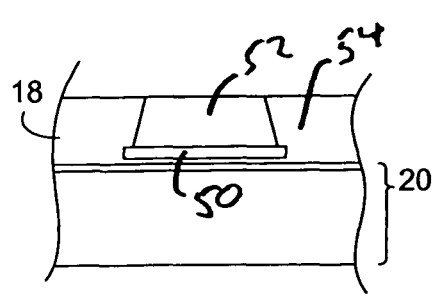
FIG. 2D is a cross-section of the device precursor after growth of light-transmitting medium.
Figure 2E:
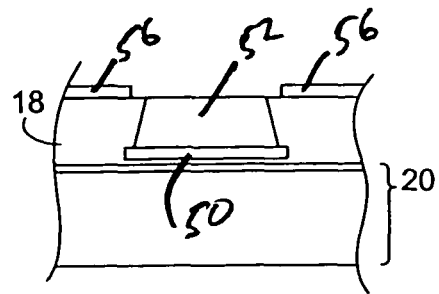
FIG. 2E is a cross-section of the device precursor after formation of a mask on the device precursor of FIG. 2D.
Figure 2F:
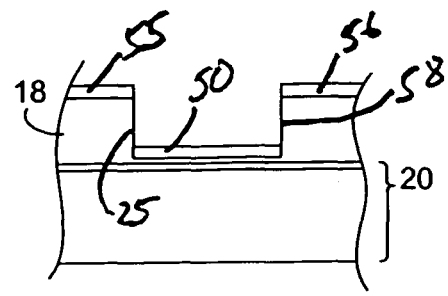
FIG. 2F is a cross-section of the device precursor of FIG. 2E after etching the device precursor of FIG. 2E.
Figure 2G:
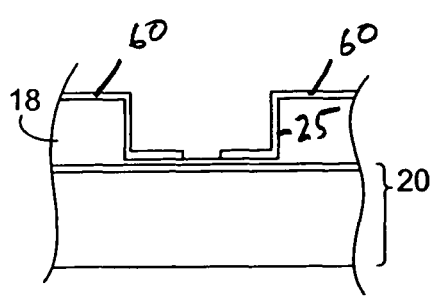
FIG. 2G is a cross-section of the device precursor after formation of a mask on the device precursor of FIG. 2F.
Figure 2H:
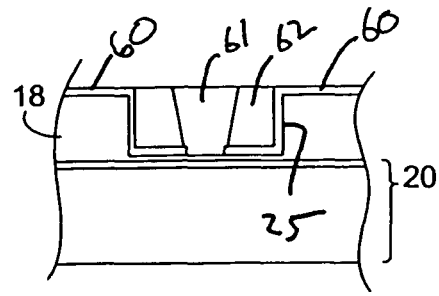
FIG. 2H is a cross-section of the device precursor after growth of active medium on the device precursor of FIG. 2G.
Figure 2I:
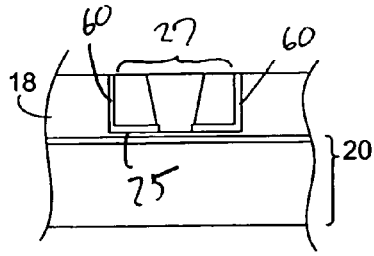
FIG. 2I is a cross-section of the device precursor after removal of a mask from the device precursor of FIG. 2H.
Figure 2J:
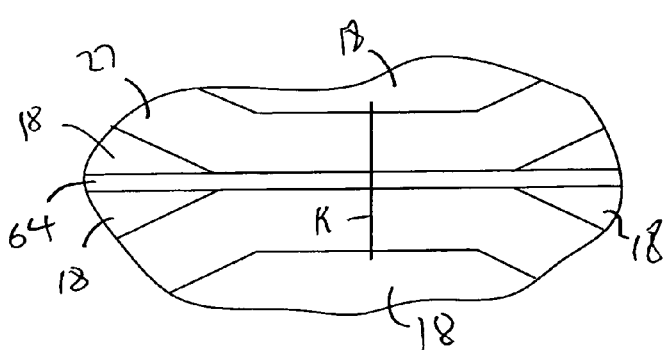
FIG. 2J and FIG. 2K illustrate the device precursor after the formation of a mask on the device precursor of FIG. 2I.
Figure 2K:
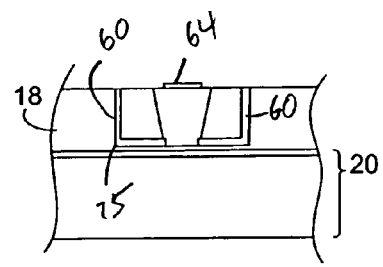
Figure 2L:
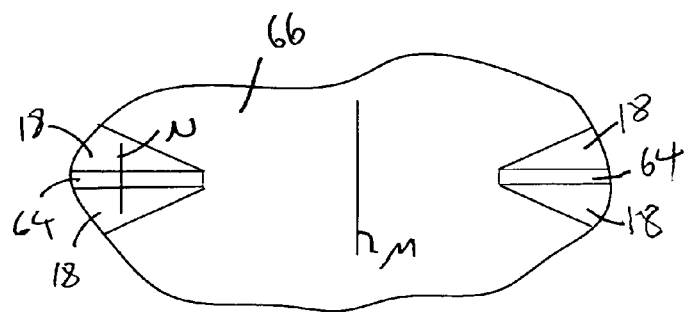
FIG. 2L through FIG. 2N illustrate the device precursor after etching of the device precursor of FIG. 2J and FIG. 2K.
Figure 2M:
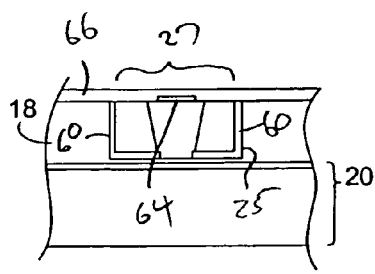
Figure 2N:
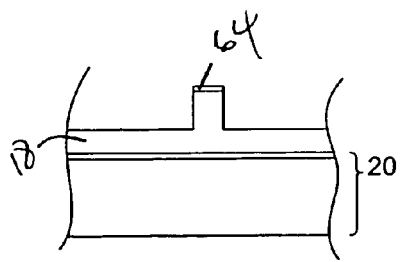
Figure 2O:
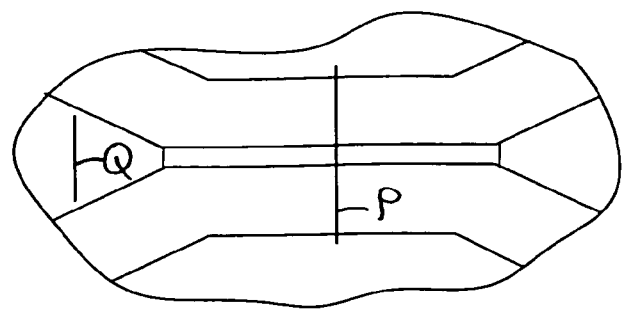
FIG. 2O through FIG. 2Q illustrate the device precursor after the formation of a mask on the device precursor of FIG. 2L through FIG. 2N.
Figure 2P:
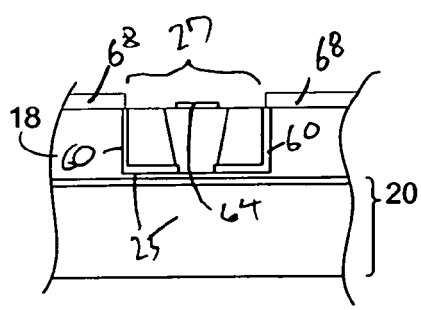
Figure 2Q:
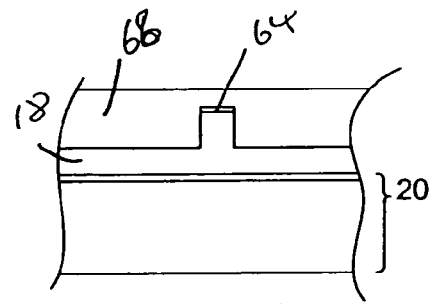
Figure 2R:
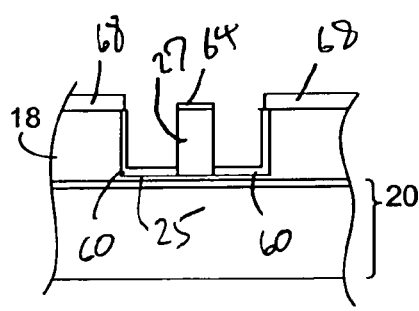

FIG. 2A through FIG. 2R illustrate an example of a method of forming an active component having a cross section as shown in FIG. 1G or FIG. 1H using fabrication technologies that are employed in the fabrication of integrated circuits, optoelectronic circuits, and/or optical devices. In the illustrated method, the original layer of light-transmitting medium 18 on the wafer becomes slab regions that extend outward from the ridge of the active medium. Although the method is illustrated using a silicon-on-insulator wafer, the method can be used on other platforms.

The method is performed on a wafer or chip that serves as a device precursor. The device precursor has a layer of the light-transmitting 18 positioned on a base as shown in FIG. 2A. FIG. 2A is a cross-section of the device precursor. The layer of the light-transmitting medium 18 has the thickness that is desired for the slab region of the light-transmitting medium 18. As a result, the slab regions of the light-transmitting medium 18 will have required uniformity of thickness. The method is illustrated using a silicon-on-insulator wafer or chip as the device precursor. As a result, the illustrated wafer has a layer of silicon with the thickness that is desired for the slab regions.

FIG. 2B and FIG. 2C illustrate a first mask 50 formed on the device precursor of FIG. 2A. FIG. 2B is a topview of the device precursor. FIG. 2C is a cross section of the device precursor shown in FIG. 2B taken along the line labeled C. The first mask 50 protects the region where the recess 25 is to be formed. A suitable first mask includes, but is not limited to, a mask on which the light-transmitting medium can be grown using techniques such as chemical vapor deposition (CVD), plasma-enhanced chemical vapor deposition (PECVD), or low pressure chemical vapour deposition (LPCVD). When the light-transmitting medium 18 is silicon, a suitable first mask 50 includes, but is not limited to, a silicon dioxide mask such as a silica mask deposited using TEOS (tetraethylorthosilicate), a silicon nitride mask, or an $Si_3O_4$ mask.

The light-transmitting medium 18 is grown on the exposed light-transmitting medium 18 so as to provide the device precursor as shown in FIG. 2D. Suitable methods for this growth include selective area growth where the light-transmitting medium 18 is epitaxially grown on the exposed areas of the light-transmitting medium 18 without being grown on the mask 50. FIG. 2D is a cross-section of the device precursor. When the light-transmitting medium 18 is silicon and the first mask 50 is a silica mask, polysilicon 52 grows on the first mask 50 while single crystal silicon 54 grows on the exposed light-transmitting medium 18. In some instances, a smoothing process such as chemical-mechanical polishing (CMP) is subsequently employed to achieve the desired thickness of the light-transmitting medium 18 on the device precursor and ensure the surface is uniformly flat.

A second mask 56 is formed on the device precursor of FIG. 2D so as to provide the device precursor of FIG. 2E. FIG. 2E is a cross-section of the device precursor taken through a location where the active component will be formed such as the cross section of FIG. 2C. The second mask 56 protects the regions of the device precursor that are not overlying the first mask 50 and leaves exposed the regions of the light-transmitting medium over the first mask 50. A suitable second mask includes, but is not limited to, a silica mask, a silicon nitride mask, and a photoresist mask.

A first etch is performed on the device precursor of FIG. 2E so as to form the recess 25 (FIG. 1A and FIG. 1B) in the device precursor of FIG. 2F. FIG. 2F is a cross-section of the device precursor taken through a location where the active component will be formed. The first etch is performed for a duration that exposes the first mask 50. Additionally, the first etch is selected such that the first mask 50 acts as an etch stop. When the light-transmitting medium is silicon, the active medium is germanium, and the first mask 50 is silica, a suitable first etch includes, but is not limited to, a dry etch with employs compounds that include or consist of chlorine and/or fluorine such as $CF_4$, $SF_6$ or $Cl_2$ and combinations thereof.

The second mask 56 is removed and a third mask 60 is formed on the device precursor of FIG. 2F so as to provide the device precursor of FIG. 2G. The third mask 60 is formed such that the region where the ridge of the active medium is to be located is exposed while the remainder of the illustrated portion of the device precursor is protected. A suitable third mask 60 includes, but is not limited to, a silicon dioxide mask deposited using TEOS (tetraethylorthosilicate), a silicon nitride mask, or an $Si_3O_4$ mask.

The active medium 27 is grown on the exposed light-transmitting medium 18 and on the third mask 60 on the device precursor of FIG. 2G. Excess active medium is removed down to the top of the third mask 60 so as to provide the device precursor as shown in FIG. 2H. FIG. 2H is a cross-section of the device precursor. When the light-transmitting medium 18 is silicon, the third mask 60 is a silica mask, and the active medium is germanium, single crystal germanium silicon 61 grows on the exposed light-transmitting medium 18 while poly-crystal germanium 62 grows on the mask. In some instances, a smoothing process and/or a planarization process such as a chemical-mechanical polishing (CMP), can be employed to smooth the uppermost surface of the device precursor and/or to achieve the desired thickness of the active medium and/or light-transmitting medium 18 on the device precursor and/or to remove excess active medium so as to expose the uppermost portion of the third mask 60 as shown in FIG. 2H.

The exposed portion of the third mask 60 is removed from the device precursor of FIG. 2H so as to provide the device precursor of FIG. 2I. Suitable methods for removing the third mask 60 include, but are not limited to, wet etching with hydrofluoric acid in the case of a silica third mask 60, and wet etching with phosphoric acid in the case of a silicon nitride third mask 60.

A fourth mask 64 is formed on the device precursor of FIG. 2I so as to provide the device precursor of FIG. 2J and FIG. 2K. FIG. 2J is a topview of the device precursor. FIG. 2K is a cross-section of the device precursor taken along the line labeled K in FIG. 2J. The fourth mask 64 is formed such that the region where the ridge of the active medium and the ridge of the light-transmitting medium 18 are to be located is protected by the fourth mask 64. The fourth mask 64 leaves exposed the portion of the active medium that is located over the slab regions of the light-transmitting medium and the portion of the active medium located in the recess 25 shown in FIG. 1A and FIG. 1B. A suitable fourth mask 64 includes, but is not limited to, a silicon dioxide mask such as a silica mask deposited using TEOS (tetraethylorthosilicate), a silicon nitride mask, or an $Si_3O_4$ mask.

A fifth mask 66 is formed on the device precursor of FIG. 2J and FIG. 2K and a device waveguide etch is performed so as to provide the device precursor of FIG. 2L through FIG. 2N. FIG. 2L is a topview of the device precursor. FIG. 2M is a cross-section of the device precursor taken along the line labeled M in FIG. 2L. FIG. 2N is a cross-section of the device precursor taken along the line labeled N in FIG. 2L. The fifth mask 66 is formed such that the regions of the device where the slab portions of the light-transmitting medium are to be formed remain exposed but the fourth mask 64 and the fifth mask 66 protect the remainder of the illustrated portion of the device. The device waveguide etch forms the slab portions of the light-transmitting medium and is accordingly performed for a duration that provides the ridge of the light-transmitting medium with the desired height above the slab portions of the light-transmitting medium as shown in FIG. 2N. A suitable fifth mask 66 includes, but is not limited to a photoresist.

The fifth mask 66 is removed from the device precursor of FIG. 2L through FIG. 2N and a sixth mask 68 is formed on the result so as to provide the device precursor of FIG. 2O through FIG. 2Q. FIG. 2O is a topview of the device precursor. FIG. 2P is a cross-section of the device precursor taken along the line labeled P in FIG. 2O. FIG. 2Q is a cross-section of the device precursor taken along the line labeled Q in FIG. 2O. The sixth mask 68 protects the portions of the light-transmitting medium 18 that are exposed by the removal of the fifth mask 66. The fourth mask 64 continues to protect the region where the ridge of the active medium is to be formed.

Figure 2S:
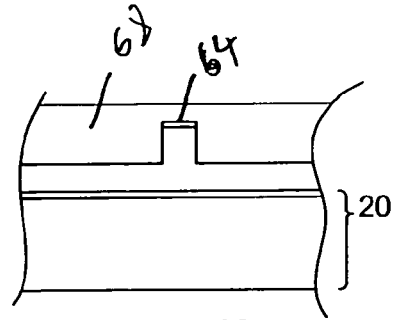

A component waveguide etch is performed on the device precursor of FIG. 2O through FIG. 2Q so as to provide the device precursor of FIG. 2R and FIG. 2S. FIG. 2R corresponds to the cross-section of the device precursor of FIG. 2P but is shown after the component waveguide etch. FIG. 2S corresponds to the cross-section of the device precursor of FIG. 2Q but is shown after the component waveguide etch. The component waveguide etch is performed for a duration that exposes the portion of the third mask 60 located in the recess 25. Additionally, the component waveguide etch is selected such that the third mask 60 acts as an etch stop. When the light-transmitting medium 18 is silicon, the active medium is germanium, and the third mask 60 is silica, a suitable second etch that permits the third mask to act as an etch stop includes, but is not limited to, a dry etch that uses compounds that include or consist of chlorine, and/or fluorine such as $CF_4$, $SF_6$ or $Cl_2$ and combinations thereof. As is evident from FIG. 2R, the component waveguide etch forms the ridge of the active medium and accordingly defines the component waveguide.

Figure 2T:
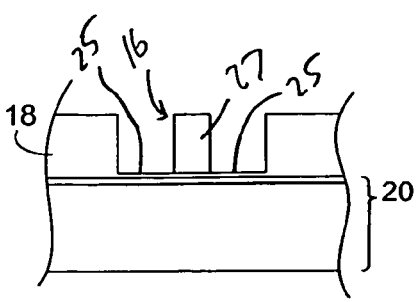
FIG. 2T and FIG. 2U illustrate the device precursor after removal of the masks from the device precursor of FIG. 2 and FIG. 2S.
Figure 2U:
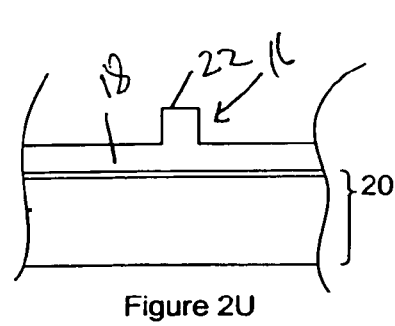

The third mask 60, the fourth mask 64, and the sixth mask 68 are removed from the device precursor of FIG. 2R and FIG. 2S to provide the device precursor of FIG. 2T and FIG. 2U. FIG. 2T corresponds to the cross-section of the device precursor of FIG. 2R but is shown after the removal of the masks. FIG. 2U corresponds to the cross-section of the device precursor of FIG. 2S but is shown after the removal of the masks.

Integrated circuit fabrication techniques can be employed to add any doped regions, electrical conductors and electrical current carriers to the device precursor of FIG. 2T so as to provide the active component of FIG. 1G or FIG. 1H.

Additional details about the fabrication and operation of an active component having a cross section according to FIG. 1G and particularly the doped regions is described in U.S. patent application Ser. No. 13/385,099, filed on Feb. 1, 2012, entitled "Optical Component Having Reduced Dependency on Etch Depth;" and also in U.S. patent application Ser. No. 13/385,372, filed on Feb. 15, 2012, entitled "Optical Component Having Reduced Dependency on Etch Depth;" each of which is incorporated herein in its entirety and can be applied to the fabrication of the active components disclosed herein. Additional details about the fabrication and operation of an active component having a cross section such as the FIG. 1H and particularly the electrical current carriers is described in U.S. patent application Ser. No. 13/374,784, filed on Jan. 12, 2012, entitled "Optical Device Having Reduced Optical Leakage," and incorporated herein in its entirety and can be applied to the fabrication of the active components disclosed herein.

Although the above description describes masks using numerical identifiers such as first, second, third, etc., these identifiers denote different masks and not sequence. For instance, the above steps can be arranged so the component waveguide etch is performed before the device waveguide etch. In this example, the mask would be used in a sequence other than the sequence indicated by the numerical identifier. Other variations are possible. For instance, rather than removing the portion of the third mask 60 as disclosed in the context of FIG. 2I above, the third mask 60 can be shaped such that the regions of the device where the slab portions of the light-transmitting medium are to be formed remain exposed. A suitable method for shaping the third mask 60 includes but is not limited to, etching the third mask. After shaping the third mask 60, the fourth mask 64 can be formed over the remaining portions of the third mask 60 as disclosed above and the fifth mask 66 can then be formed so as to protect the exposed active medium 27. As a result, the third mask 60, fourth mask 64, and the fifth mask 66 protect the portions of the device precursor that are protected in FIG. 2L through FIG. 2N. Using the resulting device precursor, the above method can proceed from the device waveguide etch discussed above.

FIG. 1A and FIG. 1B each illustrate a portion of the waveguide 16 acting as an output waveguide. For instance, two different portions of the waveguide shown in FIG. 1A and FIG. 1B have the first structure. In some applications, one of these two portions can act primarily as an output waveguide that carriers light signals away from the active component. However, in many applications, the output waveguide is optional. For instance, when the active component is a light sensor that terminates the waveguide 16, the component waveguide can terminate the waveguide 16 and an output waveguide is optional. In some instances, the presence of an output waveguide can facilitate the fabrication process even though it does not add functionality to the device. Accordingly, in some instances, the output waveguide is a dummy waveguide.

Although the above method is described in the context of active components such as modulators and light sensors, the above method can be employed to fabricate a ridge of any type of waveguide on a device. In some instances, the above method is employed to fabricate a ridge of a waveguide that is not interfaced with another waveguide. For instance, the above method is employed to fabricate a ridge of a component waveguide that is not interfaced with a device waveguide or a device waveguide that is not interfaced with another waveguide. Accordingly, the above methods are not limited to the fabrication of waveguides in active components.

Other embodiments, combinations and modifications of this invention will occur readily to those of ordinary skill in the art in view of these teachings. Therefore, this invention is to be limited only by the following claims, which include all such embodiments and modifications when viewed in conjunction with the above specification and accompanying drawings.

The invention claimed is:

1. A method of forming an optical device, comprising:
generating a device precursor having a layer of a light-transmitting medium on a base;
forming an etch stop on the layer of light-transmitting medium;
growing an active medium on the etch stop and on the light-transmitting medium such that the light-transmitting medium is between the base and the grown active medium; and
etching the grown active medium down to the etch stop so as to define a ridge in the active medium, the ridge of active medium defining a portion of a component waveguide configured to guide a light signal through an active component on the device.

2. The method of claim 1, wherein the etch stop is formed such that the etch stop protects a portion of the light-transmitting medium while leaving exposed another portion of the light-transmitting medium.

3. The method of claim 1, wherein the active medium is grown on the exposed portion of the light-transmitting medium.

4. The method of claim 3, wherein the ridge of the active medium directly contacts the light-transmitting medium.

5. The method of claim 1, wherein a portion of the layer of light-transmitting medium extends outwards from under the ridge of active medium.

6. The method of claim 1, further comprising:
growing a second layer of the light-transmitting medium on the layer of the light-transmitting medium, the second layer being grown before the active medium is grown.

7. The method of claim 6, wherein growing the second layer of the light-transmitting medium includes growing the second layer of the light-transmitting medium on the etch stop.

8. The method of claim 7, further comprising:
etching the portion of the second layer of the light-transmitting medium down to the etch stop so as to expose at least a portion of the etch stop.

9. The method of claim 8, wherein the active medium is grown on the exposed portion of the etch stop.

10. The method of claim 9, wherein the light-transmitting medium is silicon and the active medium includes germanium.

11. The method of claim 6, further comprising:
etching the light-transmitting medium after growing the second layer of the light-transmitting medium, the etch of the light-transmitting medium defining a ridge a ridge in the light-transmitting medium, the ridge of light-transmitting medium defining a portion of a device waveguide that is aligned with the component waveguide such that the component waveguide and the device waveguide exchange light signals.

12. The method of claim 11, wherein the device waveguide and the component waveguide are butt-coupled.

13. The method of claim 1, wherein the active component is selected from a group consisting of a light sensor and an optical modulator.

\* \* \* \* \*